(12) United States Patent
Sangu et al.

(10) Patent No.: US 12,697,687 B2
(45) Date of Patent: Aug. 4, 2026

(54) LASER CRYSTALLIZATION APPARATUS

(71) Applicant: Samsung Display Co., LTD., Yongin-si (KR)

(72) Inventors: Akifumi Sangu, Hwaseong-si (KR); Je Kil Ryu, Suwon-si (KR); Cheol Ho Park, Suwon-si (KR); Hae Sook Lee, Hwaseong-si (KR); Jin Hong Jeun, Hwaseong-si (KR); Young Su Chae, Asan-si (KR); Gyoo Wan Han, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 1073 days.

(21) Appl. No.: 17/503,363

(22) Filed: Oct. 18, 2021

(65) Prior Publication Data

US 2022/0212291 A1 Jul. 7, 2022

(30) Foreign Application Priority Data

Jan. 5, 2021 (KR) ........................ 10-2021-0000899

(51) Int. Cl.
| | |
|---|---|
| *B23K 26/50* | (2014.01) |
| *B23K 26/064* | (2014.01) |
| *B23K 101/40* | (2006.01) |
| *C30B 28/00* | (2006.01) |
| *C30B 28/02* | (2006.01) |
| (Continued) | |

(52) U.S. Cl.
CPC .......... *B23K 26/50* (2015.10); *B23K 26/0648* (2013.01); *G02B 3/06* (2013.01); *G02F*

*1/1303* (2013.01); *B23K 2101/40* (2018.08); *C30B 28/00* (2013.01); *C30B 28/02* (2013.01)

(58) Field of Classification Search
None
See application file for complete search history.

(56) References Cited

U.S. PATENT DOCUMENTS

| | | | | |
|---|---|---|---|---|
| 5,683,480 | A * | 11/1997 | Taniguchi | ............ G02B 27/126 |
| | | | | 359/638 |
| 6,563,843 | B1 | 5/2003 | Tanaka | |
| 7,782,535 | B2 | 8/2010 | Mikliaev et al. | |
| | | (Continued) | | |

FOREIGN PATENT DOCUMENTS

| | | | |
|---|---|---|---|
| CN | 111508817 A | 8/2020 | |
| EP | 1076359 A2 * | 2/2001 | ......... B23K 26/0604 |
| | | (Continued) | |

OTHER PUBLICATIONS

Extended European Search Report dated Jun. 1, 2022, for European Patent Application No. 22150376.6.

*Primary Examiner* — Edward F Landrum
*Assistant Examiner* — Theodore J Evangelista
(74) *Attorney, Agent, or Firm* — CANTOR COLBURN LLP

(57) ABSTRACT

A laser crystallization apparatus according to an embodiment includes a light source unit irradiating a laser beam; and an optical unit to which the laser beam is incident, wherein the optical unit includes a first portion and a second portion bonded to each other on a bonded surface, and a first width of the first portion and a second width of the second portion are the same as each other on the bonded surface based on a direction parallel to the incident direction of the laser beam.

19 Claims, 12 Drawing Sheets

(51) Int. Cl.
    *G02B 3/06*         (2006.01)
    *G02F 1/13*         (2006.01)

(56)         References Cited

U.S. PATENT DOCUMENTS

| | | | |
|---|---|---|---|
| 9,784,950 | B2 | 10/2017 | Saori et al. |
| 2003/0203602 | A1 | 10/2003 | Tanaka |
| 2004/0252743 | A1* | 12/2004 | Anikitchev ............ G02B 27/09 |
| | | | 372/97 |
| 2007/0019696 | A1 | 1/2007 | Lai et al. |
| 2007/0054479 | A1 | 3/2007 | Tanaka |
| 2007/0196967 | A1 | 8/2007 | Graefe et al. |
| 2008/0112057 | A1 | 5/2008 | Ono et al. |
| 2020/0171600 | A1 | 6/2020 | Lee et al. |

FOREIGN PATENT DOCUMENTS

| | | |
|---|---|---|
| EP | 1076359 | 2/2021 |
| JP | H08-257770 | 10/1996 |
| JP | 2001127003 A | 5/2001 |
| JP | 2004-103628 | 4/2004 |
| JP | 2013-105943 | 5/2013 |
| JP | 5617884 | 11/2014 |
| KR | 1020080042690 A | 5/2008 |
| KR | 10-0951370 | 4/2010 |
| KR | 10-2018-0003496 | 1/2018 |
| KR | 10-1918252 | 11/2018 |
| WO | 2007122061 A1 | 11/2007 |

* cited by examiner

LASER CRYSTALLIZATION APPARATUS

CROSS-REFERENCE TO RELATED APPLICATION

This application claims priority from and the benefit of Korean Patent Application No. 10-2021-0000899, filed on Jan. 5, 2021, which is hereby incorporated by reference for all purposes as if fully set forth herein.

BACKGROUND

Field

Embodiments of the invention relate generally to a laser crystallization apparatus.

Discussion of the Background

A liquid crystal display (LCD) and an organic light emitting diode (OLED) display, which are types of flat panel display devices, can be fabricated to be thin and light, so they are commonly used as a display device for mobile electronic devices, and their application is coverage is being extended to large-scale display devices. In particular, as the necessity for a display device requiring high speed operational characteristics emerges, research for such a display device is actively ongoing.

In order to satisfy the high speed operational characteristics of a display device, a channel region of a thin film transistor (TFT) is formed by using polycrystalline silicon instead of amorphous silicon.

As a method of forming polycrystalline silicon, an annealing method using a laser has been disclosed.

Meanwhile, as a glass substrate for forming the display device is becoming larger, it is important to irradiate a laser beam over a wide area.

The above information disclosed in this Background section is only for understanding of the background of the inventive concepts, and, therefore, it may contain information that does not constitute prior art.

SUMMARY

An embodiment is to provide a laser crystallization apparatus capable of irradiating a laser beam to a large area without increasing a manufacturing cost.

Additional features of the inventive concepts will be set forth in the description which follows, and in part will be apparent from the description, or may be learned by practice of the inventive concepts.

A laser crystallization apparatus according to an embodiment includes a light source unit irradiating a laser beam; and an optical unit to which the laser beam is incident in an incident direction. The optical unit includes a first portion and a second portion bonded to each other on a bonded surface, and a first width of the first portion and a second width of the second portion are the same as each other on the bonded surface based on a direction parallel to the incident direction of the laser beam.

Based on a direction perpendicular to the incident direction of the laser beam, the first length of the first portion and the second length of the second portion may be different from each other.

The first portion and the second portion may be bonded by optical contact bonding or welding.

The bonded surface may be parallel to the incident direction of the laser beam.

The bonded surface may be inclined to form a predetermined angle with the incident direction of the laser beam.

Based on a direction perpendicular to the incident direction of the laser beam, the width of the bonded surface may be about 0.3% to about 0.6% of the length of the optical unit.

The length of the optical unit may be about 2000 mm to about 2500 mm based on the direction perpendicular to the incident direction of the laser beam.

A laser crystallization apparatus according to another embodiment includes a light source unit irradiating a laser beam; and an optical unit to which the laser beam is incident in an incident direction and including a plurality of sub-optical units, wherein each of a plurality of sub-optical units includes a first portion and a second portion bonded to each other on a bonded surface, and a plurality of sub-optical units are sequentially arranged based on a direction parallel to the incident direction of the laser beam.

A plurality of sub-optical units may include a first sub-optical unit and a second sub-optical unit, and the length of the first portion of the first sub-optical unit may be different from the length of the first portion of the second sub-optical unit.

The bonded surface of the first sub-optical unit and the bonded surface of the second sub-optical unit may be disposed to offset each other in the direction parallel to the incident direction of the laser beam.

Based on the direction parallel to the incident direction of the laser beam, the first width of the first portion and the second width of the second portion may be the same as each other on the bonded surface.

The bonded surface of the first sub-optical unit and the bonded surface of the second sub-optical unit may be parallel to the incident direction of the laser beam.

The bonded surface of the first sub-optical unit and the bonded surface of the second sub-optical unit may be inclined to form a predetermined angle with the incident direction of the laser beam.

Based on the direction perpendicular to the incident direction of the laser beam, the width of the bonded surface of the first sub-optical unit may be about 0.3% to about 0.6% of the length of the first sub-optical unit.

The length of the first sub-optical unit may be about 2000 mm to about 2500 mm.

A plurality of sub-optical units may be disposed to be bonded along the incident direction of the laser beam.

A plurality of sub-optical units may be disposed to be separated from each other along the incident direction of the laser beam.

A laser crystallization apparatus according to an embodiment includes a light source unit irradiating a laser beam and an optical unit to which the laser beam is incident in an incident direction, the optical unit includes a first portion and a second portion bonded to each other on a bonded surface, and the bonded surface is inclined to form a predetermined angle with the incident direction of the laser beam.

According to the laser crystallization apparatus according to the embodiments, the laser beam may be irradiated to a large-sized area without increasing a manufacturing cost.

The effects of the embodiments are not limited to the above-described effect, and it is obvious that it may be variously extended in a range that does not deviate from the spirit and scope of the embodiments.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
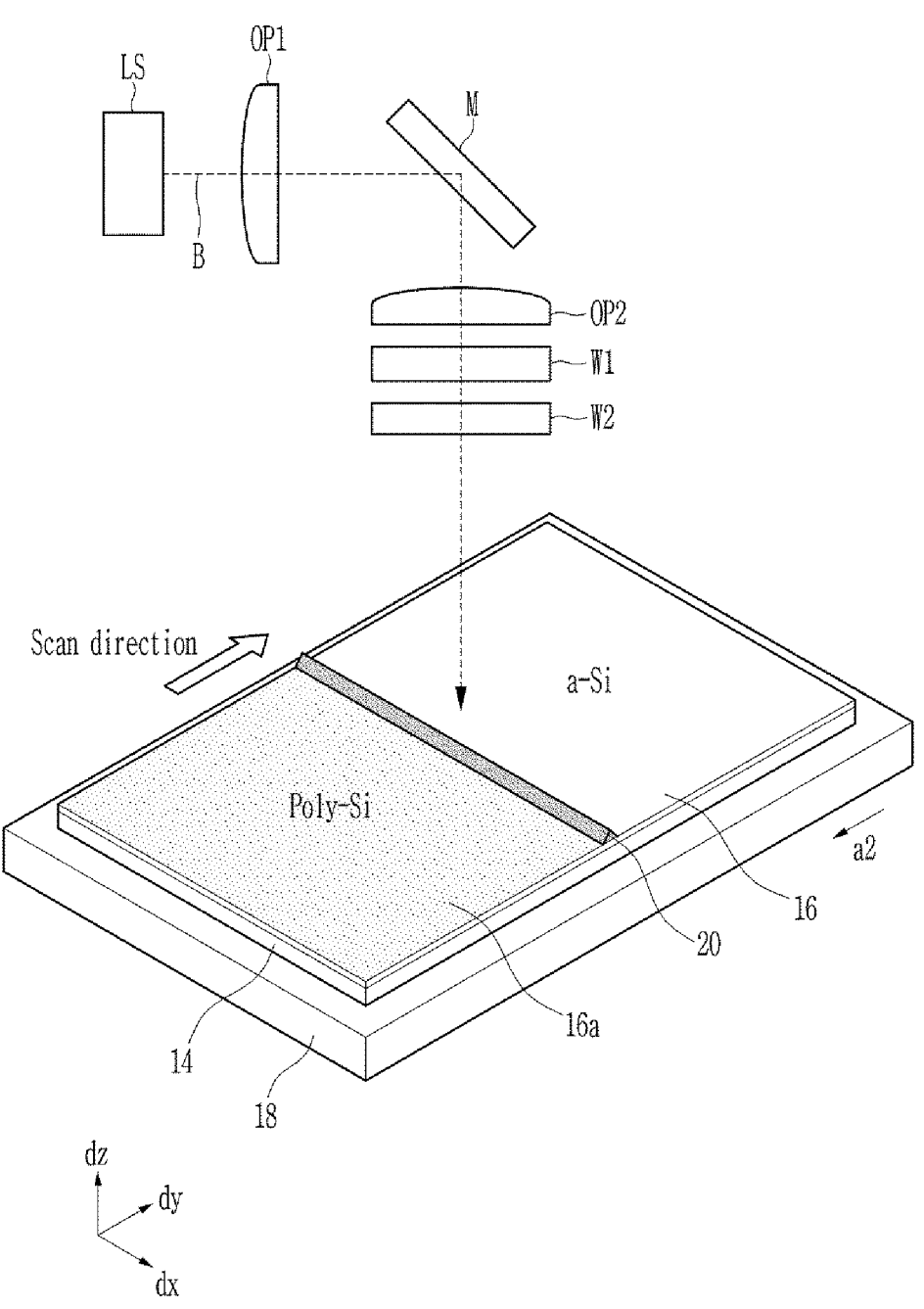
FIG. 1 is a schematic perspective view illustrating a laser crystallization apparatus according to an embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are illustrated in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the dx-axis, the dy-axis, and the dz-axis are not limited to three axes of a rectangular coordinate system, such as the x, y, and z-axes, and may be interpreted in a broader sense. For example, the dx-axis, the dy-axis, and the dz-axis may be perpendicular to one another, or may represent different directions that are not perpendicular to one another. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

First, referring to FIG. 1, the laser crystallization apparatus according to the present embodiment includes a light source unit LS, a first optical unit OP1, a second optical unit M, a third optical unit OP2, a fourth optical unit W1, a fifth optical unit W2, and a transporting stage 18.

According to a third direction dz, a substrate 14 including an amorphous silicon thin film 16 is disposed on a transporting stage 18, and a laser beam 20 of a line type generated from the laser crystallization apparatus according to the present embodiment is irradiated to the amorphous silicon thin film 16 from top to bottom in a direction parallel to the third direction dz to be scanned along a scan direction.

At this time, the position of the laser beam 20 is fixed, and the transporting stage 18 may move in the transporting direction a2. That is, by the movement of the transporting stage 18, the laser beam 20 scans the amorphous silicon thin film 16 to be irradiated in the scan direction of the opposite direction to the transporting direction a2, and the amorphous silicon of the scanned region 16a may be converted into polycrystalline silicon through a solidification process after the melting.

The laser beam 20 may have a line shape extending in the first direction (dx), and the crystallization operation that changes to the polycrystalline silicon may be uniformly done when the laser beam of the uniform intensity is irradiated in the first direction dx and the second direction dy.

The first optical unit OP1 may be a long-axis lens, the second optical unit M may be a mirror, the third optical unit OP2 may be a short-axis lens, and the fourth optical unit W1 and fifth optical unit W2 may be windows. The short-axis lens may be a condenser lens or an image formation lens, but embodiments are not limited thereto. The first optical unit OP1, the second optical unit M, the third optical unit OP2, the fourth optical unit W1, and the fifth optical unit W2 are not limited thereto and may be different optical apparatuses.

Figure 2:
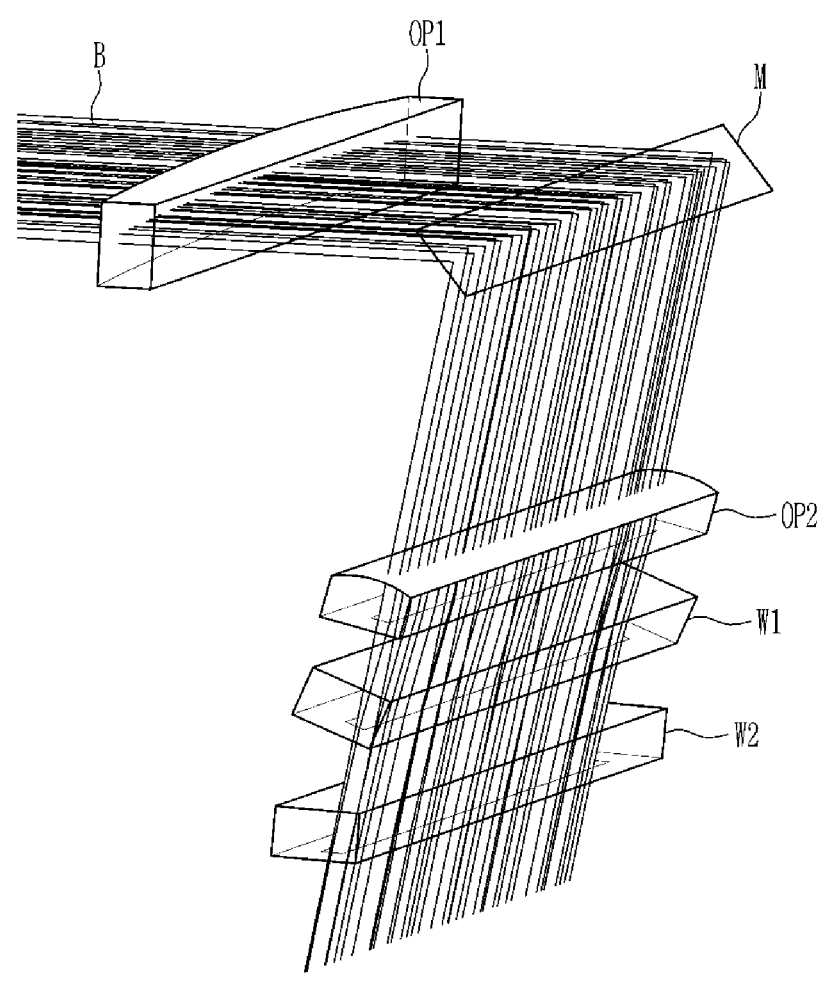
FIG. 2 is a view illustrating a part of a laser crystallization apparatus of FIG. 1.

The laser beam B supplied from the light source unit LS passes through the first optical unit OP1 and is condensed in the long-axis direction, and passes through the third optical unit OP2 and diffuses in the short axis direction after the path thereof is converted in the second optical unit M to be supplied as the laser beam 20 of the line shape through the fourth optical unit W1 and the fifth optical unit W2. As illustrated in FIG. 2, the laser beam B may include a plurality of collinear beams.

According to the laser crystallization apparatus according to the illustrated embodiment, the laser crystallization apparatus is described to include the first optical unit OP1, the second optical unit M, the third optical unit OP2, the fourth optical unit W1 and the fifth optical unit W2, however embodiments are not limited thereto. A plurality of different optical systems may be further included, and some of the first optical unit OP1, the second optical unit M, the third optical unit OP2, the fourth optical unit W1 and the fifth optical unit W2 may be omitted.

Figure 3:
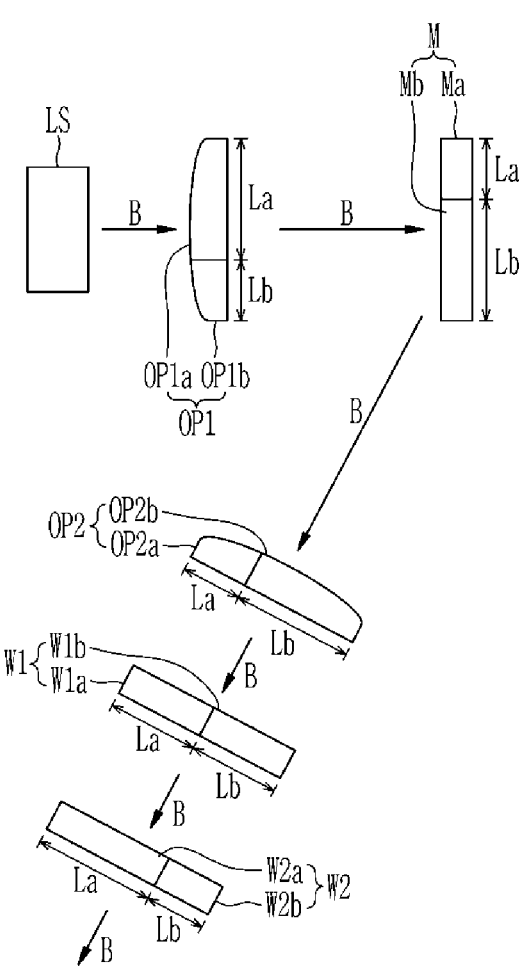
FIG. 3 is a layout view illustrating a laser crystallization apparatus according to an embodiment.
Figure 4:
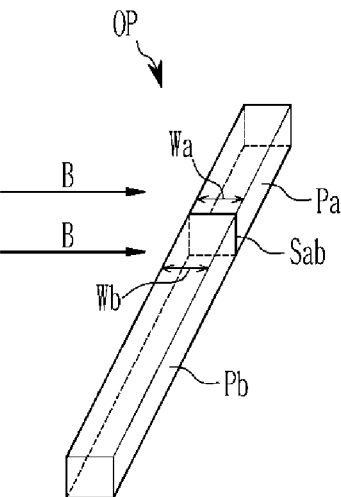
FIG. 4 is a perspective view conceptually illustrating an optical unit of a laser crystallization apparatus of FIG. 3.

Next, the optical unit of the laser crystallization apparatus according to an embodiment is described in more detail with reference to FIG. 3 and FIG. 4. FIG. 3 is a layout view of a laser crystallization apparatus according to an embodiment, and FIG. 4 is a perspective view conceptually illustrating an optical unit of a laser crystallization apparatus of FIG. 3.

Referring to FIG. 3, the laser crystallization apparatus according to an embodiment includes the first optical unit OP1, the second optical unit M, the third optical unit OP2, the fourth optical unit W1, and the fifth optical unit W2 through which the laser beam B supplied from the light source unit LS passes.

The first optical unit OP1 includes a first portion OP1a and a second portion OP1b. The first portion OP1a of the first optical unit OP1 and the second portion OP1b of the first optical unit OP1 are bonded to each other. The first portion OP1a of the first optical unit OP1 and the second portion OP1b of the first optical unit OP1 may be bonded to each other through optical contact bonding or welding.

The first length La of the first portion OP1a of the first optical unit OP1 and the second length Lb of the second portion OP1b of the first optical unit OP1 may be different from each other, but embodiments are not limited thereto. The first length La of the first portion OP1a of the first optical unit OP1 and the second length Lb of the second portion OP1b of the first optical unit OP1 may be the same as each other. Here, the first length La and the second length Lb are lengths measured based on a direction perpendicular to the direction in which the laser beam B is incident.

The sum La+Lb of the first length La of the first portion OP1a of the first optical unit OP1 and the second length Lb of the second portion OP1b of the first optical unit OP1 may be about 2000 mm to 2500 mm.

The bonded part of the first portion OP1a of the first optical unit OP1 and the second portion OP1b of the first optical unit OP1 may be parallel to the incidence direction of the laser beam B, at the bonded part of the first portion OP1a of the first optical unit OP1 and the second portion OP1b of the first optical unit OP1, and the width of the first portion OP1a of the first optical unit OP1 and the width of the second portion OP1b of the first optical unit OP1, which are measured in the direction parallel to the incident direction of the laser beam B, may be the same. Also, the widths of the first portion OP1a and second portion OP1b may vary as the surface of the first optical unit curves downward from a center to outward edges thereof.

Similarly, the second optical unit M includes a first portion Ma and a second portion Mb which are bonded to each other, and the first length La of the first portion Ma of the second optical unit M and the second length Lb of the portion Mb of the second optical unit M may be different, but embodiments are not limited thereto. The first length La of the first portion Ma of the second optical unit M and the second length Lb of the second portion Mb of the second optical unit M may be the same as each other. The sum La+Lb of the first length La of the first portion Ma of the second optical unit M and the second length Lb of the second portion Mb of the second optical unit M may be about 2000 mm to 2500 mm. Here, the first length La and the second length Lb are lengths measured based on a direction perpendicular to the direction in which the laser beam B is incident.

In addition, the bonded part of the first portion Ma of the second optical unit M and the second portion Mb of the second optical unit M may be parallel to the incident direction of the laser beam B, at the bonded part of the first portion Ma of the second optical unit M and the second portion Mb of the second optical unit M. The width of the first portion Ma of the second optical unit M and the width of the second portion Mb of the second optical unit M, which are measured in the direction parallel to the incident direction of the laser beam B, may be the same.

Similarly, the third optical unit OP2 includes a first portion OP2a and a second portion OP2b bonded to each other, and the first length La of the first portion OP2a of the third optical unit OP2 and the second length Lb of the second portion OP2b of the third optical unit OP2 may be different, but embodiments are not limited thereto. The first length La of the first portion OP2a of the third optical unit OP2 and the second length Lb of the second portion OP2b of the third optical unit OP2 may be the same as each other. The sum La+Lb of the first length La of the first portion OP2a of the third optical unit OP2 and the second length Lb of the second portion OP2b of the third optical unit OP2 may be about 2000 mm to 2500 mm. Here, first length La and the second length Lb are lengths measured based on a direction perpendicular to the direction in which the laser beam B is incident.

In addition, the bonded portion of the first portion OP2a of the third optical unit OP2 and the second portion OP2b of the third optical unit OP2 may be parallel to the incident direction of the laser beam B, at the bonded portion of the first portion OP2a of the third optical unit OP2 and the second portion OP2b of the third optical unit OP2, the width of the first portion OP2a of the third optical unit OP2 and the width of the second portion OP2b of the third optical unit OP2, which are measured in the direction parallel to the incident direction of the laser beam B, may be the same as each other.

In addition, the fourth optical unit W1 includes a first portion W1a and a second portion W1b bonded to each other, and the first length La of the first portion W1a of the fourth optical unit W1 and the second length Lb of the second portion W1b of the fourth optical unit W1 may be different, but embodiments are not limited thereto. The first length La of the first portion W1a of the fourth optical unit W1 and the second length Lb of the second portion W1b of the fourth optical unit W1 may be the same as each other.

The sum La+Lb of the first length La of the first portion W1a of the fourth optical unit W1 and the second length Lb of the second portion W1b of the fourth optical unit W1 may be about 2000 mm to 2500 mm. Here, the first length La and the second length Lb are lengths measured based on a direction perpendicular to the direction in which the laser beam B is incident.

In addition, the bonded portion of the first portion W1a of the fourth optical unit W1 and the second portion W1b of the fourth optical unit W1 may be parallel to the incident direction of the laser beam B, and at the bonded portion of the first portion W1a of the fourth optical unit W1 and the second portion W1b of the fourth optical unit W1, the width of the first portion W1a of the fourth optical unit W1 and the width of the second portion W1b of the fourth optical unit W1, which are measured in the direction parallel to the incident direction of the laser beam B, may be the same as each other.

Similarly, the fifth optical unit W2 includes a first portion W2a and a second portion W2b bonded to each other, and the first length La of the first portion W2a of the fifth optical unit W2 and the second length Lb of the second portion W2b of the fifth optical unit W2 may be different, but embodiments are not limited thereto. The first length La of the first portion W2a of the fifth optical unit W2 and the second length Lb of the second portion W2b of the fifth optical unit W2 may be the same as each other. The sum La+Lb of the first length La of the first portion W2a of the fifth optical unit W2 and the second length Lb of the second portion W2b of the fifth optical unit W2 may be about 2000 mm to 2500 mm. Here, the first length La and the second length Lb are lengths measured based on a direction perpendicular to the direction in which the laser beam B is incident.

Also, the bonded portion of the first portion W2a of the fifth optical unit W2 and the second portion W2b of the fifth optical unit W2 may be parallel to the incident direction of the laser beam B, and at the bonded portion of the first portion W2a of the fifth optical unit W2 and the second portion W2b of the fifth optical unit W2, the width of the first portion W2a of the fifth optical unit W2 and the width of the second portion W2b of the fifth optical unit W2, which are measured in a direction parallel to the incident direction of the laser beam B, may be the same as each other.

The first length La of the first portion OP1a of the first optical unit OP1 may be different from or may be the same as the first length La of the first portion Ma of the second optical unit M. In addition, the second length Lb of the second portion OP1b of the first optical unit OP1 may be different from or may be the same as the second length Lb of the second portion Mb of the second optical unit M.

The first length La of the first portion Ma of the second optical unit M may be different from or may be the same as the first length La of the first portion OP2a of the third optical unit OP2. In addition, the second length Lb of the second portion Mb of the second optical unit M may be different from or may be the same as the second length Lb of the second portion OP2b of the third optical unit OP2.

The first length La of the first portion OP2a of the third optical unit OP2 may be different from or may be the same as the first length La of the first portion W1a of the fourth optical unit W1. In addition, the second length Lb of the second portion OP2b of the third optical unit OP2 may be different from or may be the same as the second length Lb of the second portion W1b of the fourth optical unit W1.

The first length La of the first portion W1$a$ of the fourth optical unit W1 may be different from or may be the same as the first length La of the first portion W2$a$ of the fifth optical unit W2, In addition, the second length Lb of the second portion W1$b$ of the fourth optical unit W1 may be different from or may be the same as the second length Lb of the second portion W2$b$ of the fifth optical unit W2.

The first length La of the first portion W2$a$ of the fifth optical unit W2 may be different from or may be the same as the first length La of the first portion OP1$a$ of the first optical unit OP1. In addition, the second length Lb of the second portion W2$b$ of the fifth optical unit W2 may be different from or may be the same as the second length Lb of the second portion OP1$b$ of the first optical unit OP1.

According to the embodiment of FIG. 3, it is described that each of the optical units OP1, M, OP2, W1, and W2 of the laser crystallization apparatus includes the first portion and the second portion bonded to each other, however it is not limited thereto, and at least one of the optical units OP1, M, OP2, W1, and W2 of the laser crystallization apparatus may include the first portion and the second portion bonded to each other.

Now, the structure of the optical units OP1, M, OP2, W1, and W2 of the laser crystallization apparatus according to the third embodiment is described in more detail with reference to FIG. 4.

The optical units OP1, M, OP2, W1, and W2 of the laser crystallization apparatus according to the embodiment of FIG. 3 may have the same structure as the optical unit OP illustrated in FIG. 4.

Referring to FIG. 4, the optical unit OP of the laser crystallization apparatus according to the embodiment includes a first portion Pa and a second portion Pb bonded to each other. The first portion Pa and the second portion Pb of the optical unit OP may include glass.

The first portion Pa and the second portion Pb of the optical unit OP may be bonded to each other at a boundary between the first portion Pa and the second portion Pb through a bonding element such as optical contact bonding or welding. A bonded surface Sab of the first portion Pa and the second portion Pb of the optical unit OP may be parallel to the incident direction of the laser beam B.

The bonded surface Sab at the boundary between the first portion Pa and the second portion Pb includes a material layer combination that includes a part of the first portion Pa adjacent the boundary, the bonding element, and a part of the second portion Pb adjacent the boundary. The bonded surface Sab may have a thickness as described herein.

In the bonded surface Sab of the first portion Pa and the second portion Pb of the optical unit OP, the first width Wa of the first portion Pa and the second width Wb of the second portion Pb measured in a direction parallel to the incident direction of the laser beam B may be the same.

As the glass substrate for forming the display device becomes larger, the laser crystallization apparatus may irradiate a laser beam over a wide area, and for this purpose, the size of the optical unit of the laser crystallization apparatus may be increased. When forming the optical unit having a large size using one glass, a manufacturing cost increases.

The laser crystallization apparatus according to the embodiment includes the optical unit including the first portion and the second portion bonded to each other, and the bonded portions of the first portion and the second portion may be bonded to each other through the optical contact bonding or the welding. Accordingly, using the bonded surfaces that include a plurality of parts instead of larger monolithic parts, it is possible to more easily diversify shapes and sizes of the optical units and form the laser crystallization apparatus including the optical units having large sizes without increasing the manufacturing cost of the laser crystallization apparatus.

Figure 5:
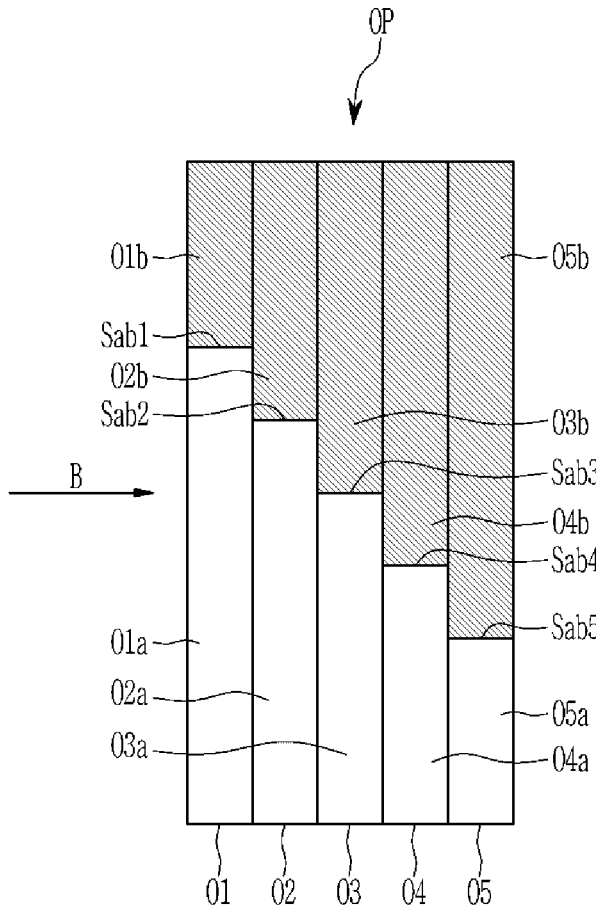
FIG. 5 is a view illustrating an example of an optical unit of a laser crystallization apparatus according to another embodiment.

Next, the laser crystallization apparatus according to another embodiment is described with reference to FIG. 5. FIG. 5 is a view illustrating an example of an optical unit of a laser crystallization apparatus according to an embodiment.

As described herein, the laser crystallization apparatus according to the present embodiment includes a plurality of optical units OP1, M, OP2, W1, and W2, and at least one among a plurality of optical units OP1, M, OP2, W1, and W2 of the laser crystallization apparatus may have the structure of the optical unit OP illustrated in FIG. 5.

Referring to FIG. 5, the optical unit OP of the laser crystallization apparatus according to the present embodiment may include a plurality of sub-optical units O1, O2, O3, O4, and O5.

The first sub-optical unit O1, the second sub-optical unit O2, the third sub-optical unit O3, the fourth sub-optical unit O4, and the fifth sub-optical unit O5 of the optical unit OP may be connected to each other.

The first sub-optical unit O1 of the optical unit OP may include a first portion O1$a$ and a second portion O1$b$ bonded to each other, the second sub-optical unit O2 of the optical unit OP may include a third portion O2$a$ and a fourth portion O2$b$ bonded to each other, the third sub-optical unit O3 of the optical unit OP may include a fifth portion O3$a$ and a sixth portion O3$b$ bonded to each other, the fourth sub-optical unit O4 of the optical unit OP may include a seventh portion O4$a$ and an eighth portion O4$b$ bonded to each other, the fifth sub-optical unit O5 of the optical unit OP may include a ninth portion O5$a$ and a tenth portion O5$b$ bonded to each other.

The first portion O1$a$ and the second portion O1$b$ of the first sub-optical unit O1 of the optical unit OP are bonded to each other on the first bonded surface Sab1, the third portion O2$a$ and the fourth portion O2$b$ of the second sub-optical unit O2 of the optical unit OP are bonded to each other on the second bonded surface Sab2, the fifth portion O3$a$ and the sixth portion O3$b$ of the third sub-optical unit O3 of the optical unit OP are bonded to each other on the third bonded surface Sab3, the seventh portion O4$a$ of the eighth portion O4$b$ of the fourth sub-optical unit O4 of the optical unit OP are bonded to each other on the fourth bonded surface Sab4, and the ninth portion O5$a$ and the tenth portion O5$b$ of the fifth sub-optical unit O5 of the optical unit OP are bonded to each other on the fifth bonded surface Sab5.

The first bonded surface Sab1 of the first sub-optical unit O1 of the optical unit OP, the second bonded surface Sab2 of the second sub-optical unit O2 of the optical unit OP, the third bonded surface Sab3 of the third sub-optical unit O3 of the optical unit OP, the fourth bonded surface Sab4 of the fourth sub-optical unit O4 of the optical unit OP, and the fifth bonded surface Sab5 of the fifth sub-optical unit O5 of the optical unit OP may be parallel to the incident direction of the laser beam B of the optical unit OP. Also, based on the direction parallel to the incident direction of the laser beam B incident to the optical unit OP, the first bonded surface Sab1 of the first sub-optical unit O1 of the optical unit OP, the second bonded surface Sab2 of the second sub-optical unit O2 of the optical unit OP, the third bonded surface Sab3 of the third sub-optical unit O3 of the optical unit OP, the fourth bonded surface Sab4 of the fourth sub-optical unit O4 of the optical unit OP, and the fifth bonded surface Sab5 of the fifth sub-optical unit O5 of the optical unit OP are not disposed in line with each other, but may be disposed to be offset from each other in a direction perpendicular to the emission of the laser beam B.

Figure 6:
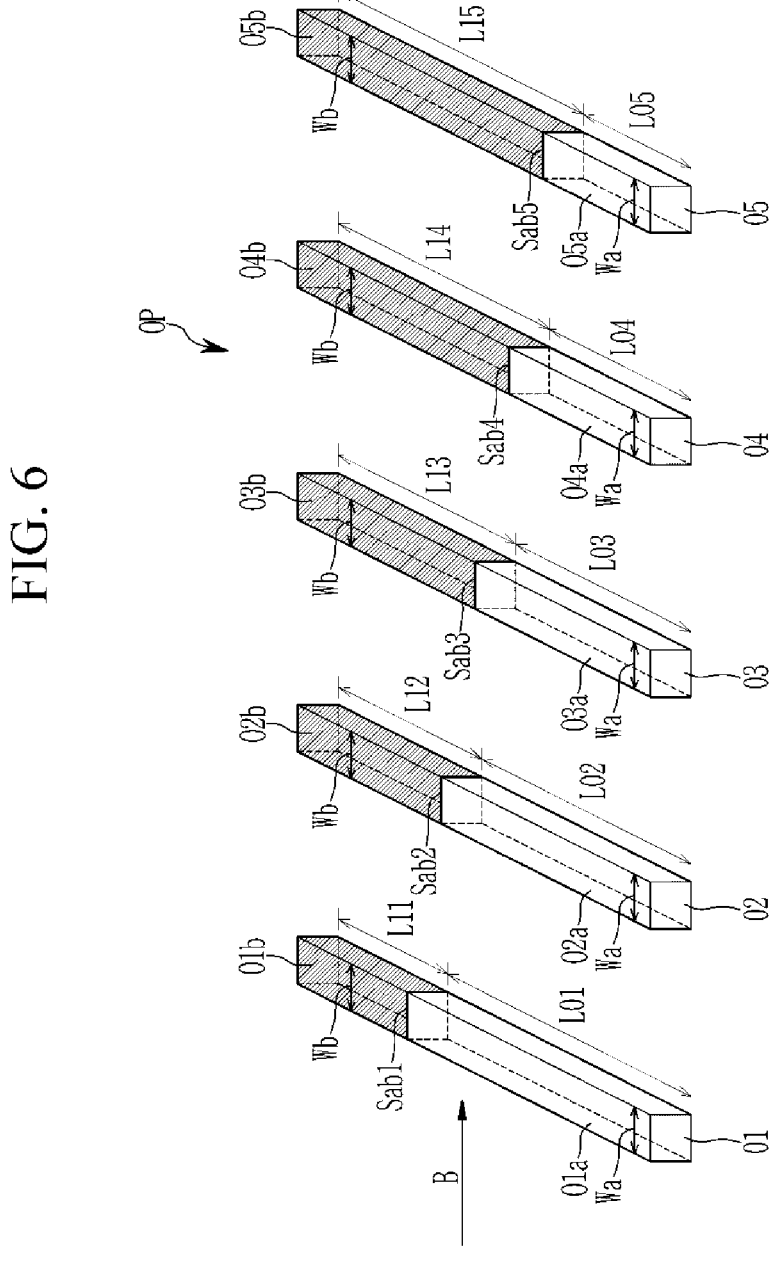
FIG. 6 is an exploded perspective view of optical units of FIG. 5.

Now, the sub-optical units of the optical unit of 5 are described in more detail with reference to FIG. 6 along with FIG. 5. FIG. 6 is an exploded perspective view of optical units of FIG. 5.

Referring to FIG. 6 along with FIG. 5, the optical unit OP of the laser crystallization apparatus according to the present embodiment includes a plurality of sub-optical units O1, O2, O3, O4, and O5.

The first sub-optical unit O1 of the optical unit OP includes a first portion O1a and a second portion O1b bonded to each other on the first bonded surface Sab1, and the first length L01 of the first portion Ola of the first sub-optical unit O1 of the optical unit OP and the second length L11 of the second portion O1b of the first sub-optical unit O1 of the optical unit OP may be different from each other or may be the same.

The first bonded surface Sab1 of the first sub-optical unit O1 of the optical unit OP may be a surface parallel to the incident direction of the laser beam B, based on the direction parallel to the incident direction of the laser beam B, and the first width Wa of the first portion Ola of the first sub-optical unit O1 and the second width Wb of the second portion O1b of the first sub-optical unit O1 may be the same as each other on the first bonded surface Sab1.

The second sub-optical unit O2 of the optical unit OP includes a third portion O2a and a fourth portion O2b bonded to each other on the second bonded surface Sab2, and the third length L02 of the third portion O2a of the second sub-optical unit O2 of the optical unit OP and the fourth length L12 of the fourth portion O2b of the second sub-optical unit O2 of the optical unit OP may be different from or the same as each other.

The second bonded surface Sab2 of the second sub-optical unit O2 of the optical unit OP may be parallel to a surface almost parallel to the incident direction of the laser beam B, based on the direction parallel to the incident direction of the laser beam B, and the first width Wa of the third portion O2a of the second sub-optical unit O2 and the second width Wb of the fourth portion O2b of the second sub-optical unit O2 may be the same as each other on the second bonded surface Sab2.

The third sub-optical unit O3 of the optical unit OP may include a fifth portion O3a and the sixth portion O3b bonded to each other on the third bonded surface Sab3, and the fifth length L03 of the fifth portion O3a of the third sub-optical unit O3 of the optical unit OP and the sixth length L13 of the sixth portion O3b of the third sub-optical unit O3 of the optical unit OP may be different from or the same as each other.

The third bonded surface Sab3 of the third sub-optical unit O3 of the optical unit OP may be a surface almost parallel to the incident direction of the laser beam B, and based on the direction parallel to the incident direction of the laser beam B, the first width Wa of the fifth portion O3a of the third sub-optical unit O3 and the second width Wb of the sixth portion O3b of the third sub-optical unit O3 may be the same as each other on the third bonded surface Sab3.

The fourth sub-optical unit O4 of the optical unit OP includes a seventh portion O4a and an eighth portion O4b bonded to each other on the fourth bonded surface Sab4, and the seventh length L04 of the seventh portion O4a of the fourth sub-optical unit O4 of the optical unit OP and the eighth length L14 of the eighth portion O4b of the fourth sub-optical unit O4 of the optical unit OP may be different from or the same as each other.

The fourth bonded surface Sab4 of the fourth sub-optical unit O4 of the optical unit OP may be a surface almost parallel to the incident direction of the laser beam B, and based on the direction parallel to the incident direction of the laser beam B, the first width Wa of the seventh portion O4a of the fourth sub-optical unit O4 and the second width Wb of the eighth portion O4b of the fourth sub-optical unit O4 may be the same as each other on the fourth bonded surface Sab4.

The fifth sub-optical unit O5 of the optical unit OP may include a ninth portion O5a and a tenth portion O5b bonded to each other on the fifth bonded surface Sab5, and the ninth length L05 of the ninth portion O5a of the fifth sub-optical unit O5 of the optical unit OP and the tenth length L15 of the tenth portion O5b of the fifth sub-optical unit O5 of the optical unit OP may be different from or the same as each other.

The fifth bonded surface Sab5 of the fifth sub-optical unit O5 of the optical unit OP may be a surface almost parallel to the incident direction of the laser beam B, and based on the direction parallel to the incident direction of the laser beam B, the first width Wa of the ninth portion O5a of the fifth sub-optical unit O5 and the second width Wb of the tenth portion O5b of the fifth sub-optical unit O5 may be the same as each other on the fifth bonded surface Sab5.

The first length L01 of the first portion Ola of the first sub-optical unit O1 of the optical unit OP, the third length L02 of the third portion O2a of the second sub-optical unit O2 of the optical unit OP, the fifth length L03 of the fifth portion O3a of the third sub-optical unit O3 of the optical unit OP, the seventh length L04 of the seventh portion O4a of the fourth sub-optical unit O4 of the optical unit OP, and the ninth length L05 of the ninth portion O5a of the fifth sub-optical unit O5 of the optical unit OP may be different from each other. Here, the first length L01, the third length L02, the fifth length L03, the seventh length L04, and the ninth length L05 may be lengths measured in the direction perpendicular to the incident direction of the laser beam B.

Similarly, the second length L11 of the second portion O1b of the first sub-optical unit O1 of the optical unit OP, the fourth length L12 of the fourth portion O2b of the second sub-optical unit O2 of the optical unit OP, the sixth length L13 of the sixth portion O3b of the third sub-optical unit O3 of the optical unit OP, the eighth length L14 of the eighth portion O4b of the fourth sub-optical unit O4 of the optical unit OP, and the tenth length L15 of the tenth portion O5b of the fifth sub-optical unit O5 optical unit OP may be different from each other. Here, the second length L11, the fourth length L12, the sixth length L13, the eighth length L14, and the tenth length L15 may be lengths measured in the direction perpendicular to the incident direction of the laser beam B.

The first portion Ola and the second portion O1b of the first sub-optical unit O1 of the optical unit OP may be bonded to each other through the optical contact bonding or the welding, the third portion O2a and the fourth portion O2b of the second sub-optical unit O2 of the optical unit OP may be bonded to each other through the optical contact bonding or the welding, the fifth portion O3a and the sixth portion O3b of the third sub-optical unit O3 of the optical unit OP may be bonded to each other through the optical contact bonding or the welding, the seventh portion O4a and the eighth portion O4b of the fourth sub-optical unit O4 of the optical unit OP may be bonded to each other through the optical contact bonding or the welding, and the ninth portion O5*a* and the tenth portion O5*b* of the fifth sub-optical unit O5 of the optical unit OP may be bonded to each other through the optical contact bonding or the welding.

Also, the first sub-optical unit O1, the second sub-optical unit O2, the third sub-optical unit O3, the fourth sub-optical unit O4, and the fifth sub-optical unit O5 of the optical unit OP may be sequentially disposed along the direction of the incident direction of the laser beam B, and the first sub-optical unit O1, the second sub-optical unit O2, the third sub-optical unit O3, the fourth sub-optical unit O4, and the fifth sub-optical unit O5 of the optical unit OP may be bonded to each other through the optical contact bonding or the welding.

Based on the direction parallel to the incident direction of the laser beam B of the optical unit OP, the first bonded surface Sab1 of the first sub-optical unit O1 of the optical unit OP, the second bonded surface Sab2 of the second sub-optical unit O2 of the optical unit OP, the third bonded surface Sab3 of the third sub-optical unit O3 of the optical unit OP, the fourth bonded surface Sab4 of the fourth sub-optical unit O4 of the optical unit OP, and the fifth bonded surface Sab5 of the fifth sub-optical unit O5 of the optical unit OP are not disposed in a line with each other, but may be disposed to be offset from each other in a direction perpendicular to the emission of the laser beam B.

According to the embodiment illustrated in FIG. 5 and FIG. 6 above, it is described that the optical unit of the laser crystallization apparatus according to the embodiment includes five sub-optical units O1, O2, O3, O4, and O5, however it is not limited thereto, and the number of the plurality of sub-optical units may be changed.

Figure 7:
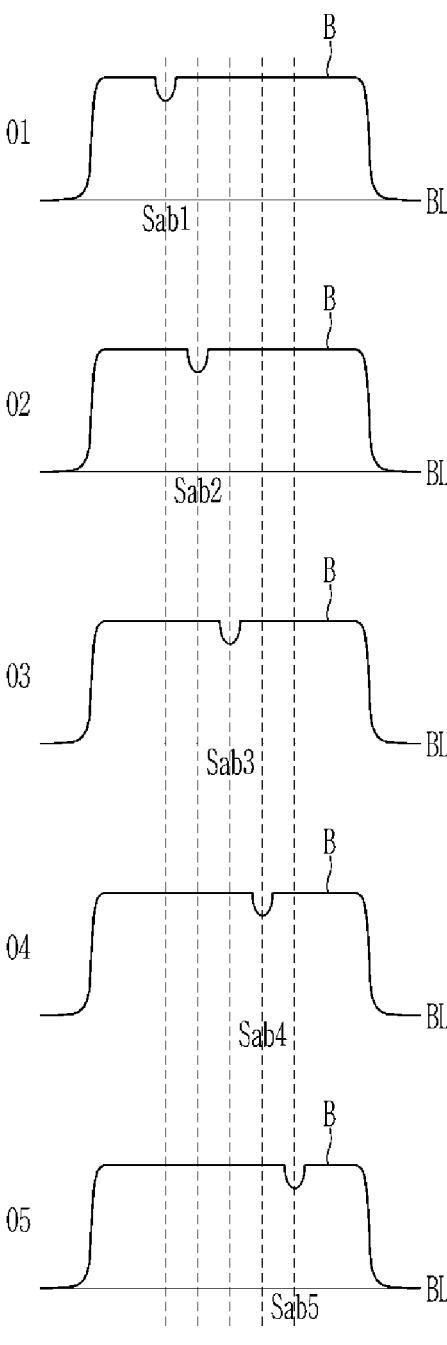
FIG. 7 is a graph conceptually illustrating changes in intensity of a laser beam passing through an optical unit of a laser crystallization apparatus according to an embodiment.

A change in intensity of a laser beam passing through the optical unit of the laser crystallization apparatus according to an embodiment is described with reference to FIG. 7 along with FIG. 5 and FIG. 6. FIG. 7 is a graph conceptually illustrating changes in intensity of a laser beam passing through an optical unit of a laser crystallization apparatus according to an embodiment.

Referring to FIG. 7 along with FIG. 5 and FIG. 6, while the laser beam B passes through the first sub-optical unit O1, the second sub-optical unit O2, the third sub-optical unit O3, the fourth sub-optical unit O4, and the fifth sub-optical unit O5 of the optical unit OP, the intensity BL of the laser beam B may be reduced on the first bonded surface Sab1 of the first sub-optical unit O1 of the optical unit OP, the second bonded surface Sab2 of the second sub-optical unit O2 of the optical unit OP, the third bonded surface Sab3 of the third sub-optical unit O3 of the optical unit OP, the fourth bonded surface Sab4 of the fourth sub-optical unit O4 of the optical unit OP, and the fifth bonded surface Sab5 of the fifth sub-optical unit O5 of the optical unit OP.

As described herein with reference to FIG. 5 and FIG. 6, based on the direction parallel to the incident direction of the laser beam B incident to the optical unit OP of the laser crystallization apparatus according to the embodiment, because the first bonded surface Sab1 of the first sub-optical unit O1 of the optical unit OP, the second bonded surface Sab2 of the second sub-optical unit O2 of the optical unit OP, the third bonded surface Sab3 of the third sub-optical unit O3 of the optical unit OP, the fourth bonded surface Sab4 of the fourth sub-optical unit O4 of the optical unit OP, and the fifth bonded surface Sab5 of the fifth sub-optical unit O5 of the optical unit OP are not disposed in line with each other, but are disposed to be offset from each other, the first bonded surface Sab1, the second bonded surface Sab2, the third bonded surface Sab3, the fourth bonded surface Sab4, and the fifth bonded surface Sab5, in which the intensity BL of the laser beam B is changed, do not overlap each other.

Accordingly, the change of the intensity BL of the laser beam B passing through the optical unit OP is not concentrated at a specific position, therefore by spacing the bonded surfaces evenly about the width of the laser beam B, the intensity of the uniform laser beam B may be supplied evenly to the substrate 14 according to the positions of the bonded surfaces.

Figure 8:
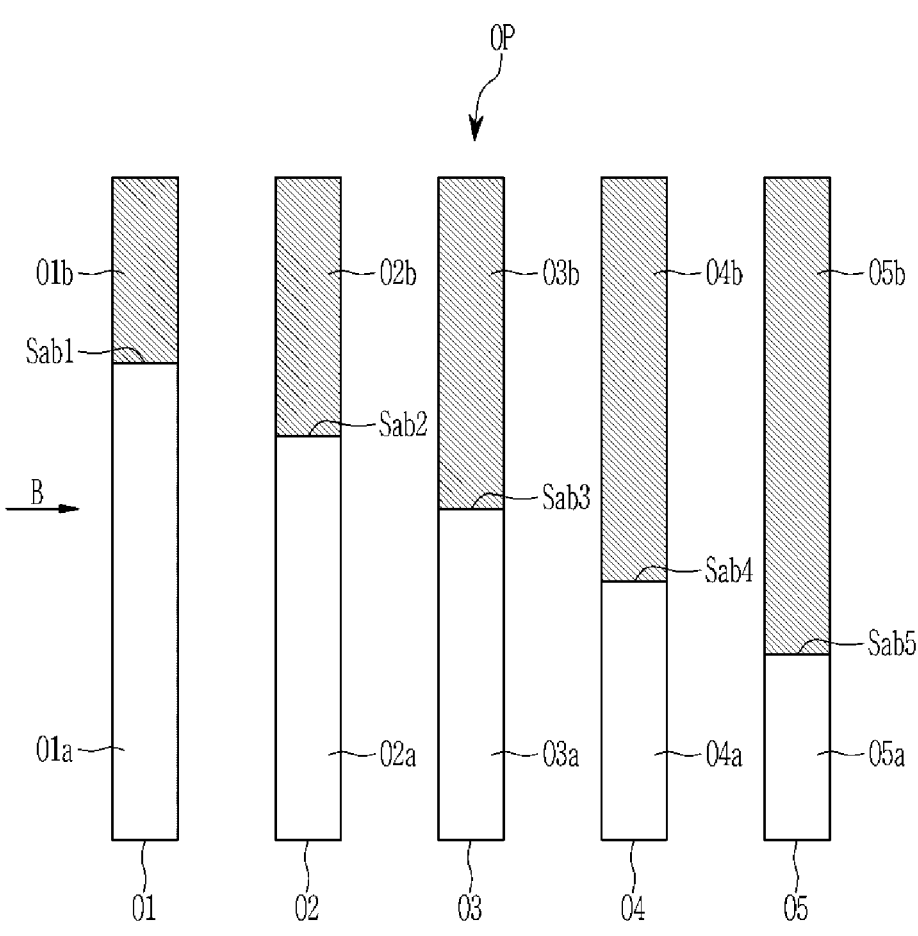
FIG. 8 is a view illustrating an example of an optical unit of a laser crystallization apparatus according to another embodiment.

Next, the laser crystallization apparatus according to another embodiment is described with reference to FIG. 8. FIG. 8 is a view illustrating one example of an optical unit of a laser crystallization apparatus according to another embodiment.

As described herein, the laser crystallization apparatus according to the present embodiment includes a plurality of optical units OP1, M, OP2, W1, and W2, at least one among a plurality of optical units OP1, M, OP2, W1, and W2 of the laser crystallization apparatus may have the structure of the optical unit OP illustrated in FIG. 8.

Referring to FIG. 8, the optical unit OP of the laser crystallization apparatus according to the present embodiment may include a plurality of sub-optical units O1, O2, O3, O4, and O5 separated from each other.

The first sub-optical unit O1 of the optical unit OP may include the first portion O1a and the second portion O1*b* bonded to each other, the second sub-optical unit O2 of the optical unit OP may include the third portion O2*a* and the fourth portion O2*b* bonded to each other, the third sub-optical unit O3 of the optical unit OP may include the fifth portion O3*a* and the sixth portion O3*b* bonded to each other, the fourth sub-optical unit O4 of the optical unit OP may include the seventh portion O4*a* and the eighth portion O4*b* bonded to each other, and the fifth sub-optical unit O5 of the optical unit OP may include the ninth portion O5*a* and the tenth portion O5*b* bonded to each other.

The first portion O1a and the second portion O1*b* of the first sub-optical unit O1 of the optical unit OP are bonded to each other on the first bonded surface Sab1, the third portion O2*a* and the fourth portion O2*b* of the second sub-optical unit O2 of the optical unit OP are bonded to each other on the second bonded surface Sab2, the fifth portion O3*a* and the sixth portion O3*b* of the third sub-optical unit O3 of the optical unit OP are bonded to each other on the third bonded surface Sab3, the seventh portion O4*a* and the eighth portion O4*b* of the fourth sub-optical unit O4 of the optical unit OP are bonded to each other on the fourth bonded surface Sab4, and the ninth portion O5*a* and the tenth portion O5*b* of the fifth sub-optical unit O5 of the optical unit OP are bonded to each other on the fifth bonded surface Sab5.

The first bonded surface Sab1 of the first sub-optical unit O1 of the optical unit OP, the second bonded surface Sab2 of the second sub-optical unit O2 of the optical unit OP, the third bonded surface Sab3 of the third sub-optical unit O3 of the optical unit OP, the fourth bonded surface Sab4 of the fourth sub-optical unit O4 of the optical unit OP, and the fifth bonded surface Sab5 of the fifth sub-optical unit O5 of the optical unit OP may be respectively parallel to the incident direction of the laser beam B incident to the optical unit OP. Also, based on the direction parallel to the incident direction of the laser beam B incident to the optical unit OP, the first bonded surface Sab1 of the first sub-optical unit O1 of the optical unit OP, the second bonded surface Sab2 of the second sub-optical unit O2 of the optical unit OP, the third bonded surface Sab3 of the third sub-optical unit O3 of the optical unit OP, the fourth bonded surface Sab4 of the fourth sub-optical unit O4 of the optical unit OP, and the fifth bonded surface Sab5 of the fifth sub-optical unit O5 of the optical unit OP are not disposed in a line with each other, but may be disposed to be offset from each other in a direction perpendicular to the emission of the laser beam B.

According to the embodiment illustrated in FIG. 8, it is described that the optical unit of the laser crystallization apparatus according to an embodiment includes the five sub-optical units O1, O2, O3, O4, and O5, however it is not limited thereto, and the number of a plurality of sub-optical units may be changed.

Many characteristics of the optical units of the laser crystallization apparatuses according to the embodiment described with reference to FIG. 1 to FIG. 7 above may be applied to the optical unit of the laser crystallization apparatus according to the present embodiment.

Figure 9:
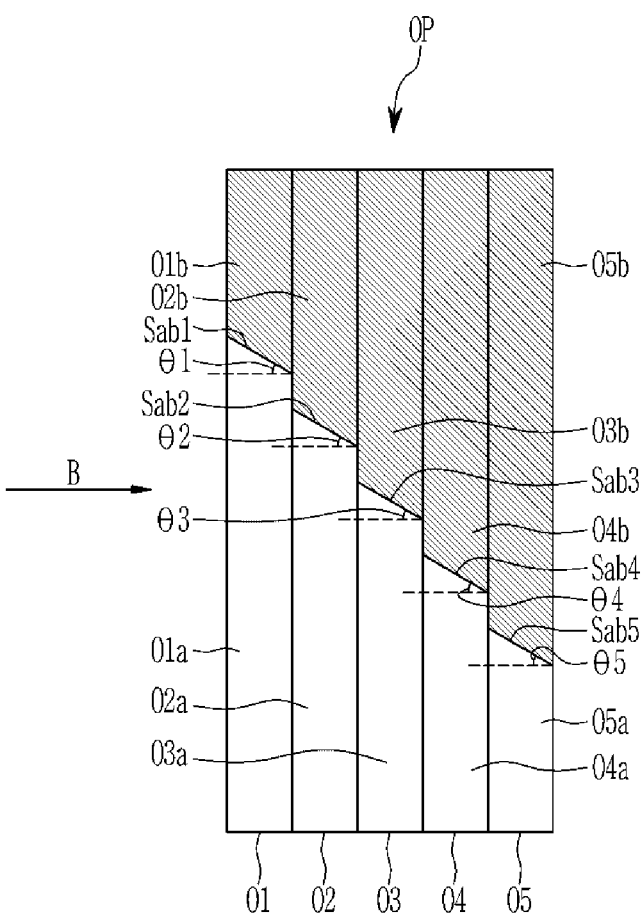
FIG. 9 is a view illustrating an example of an optical unit of a laser crystallization apparatus according to another embodiment.

Next, the laser crystallization apparatus according to another embodiment is described with reference to FIG. 9. FIG. 9 is a view illustrating one example of an optical unit of a laser crystallization apparatus according to another embodiment.

As described herein, the laser crystallization apparatus according to embodiments described herein includes a plurality of optical units OP1, M, OP2, W1, and W2, and at least one among a plurality of optical units OP1, M, OP2, W1, and W2 of the laser crystallization apparatus may have the structure of the optical unit OP illustrated in FIG. 9.

Referring to FIG. 9, the optical unit OP of the laser crystallization apparatus according to the present embodiment may include a plurality of sub-optical units O1, O2, O3, O4, and O5.

The first sub-optical unit O1, the second sub-optical unit O2, the third sub-optical unit O3, the fourth sub-optical unit O4, and the fifth sub-optical unit O5 may be sequentially disposed according to the direction parallel to the incident direction of the laser beam B of the optical unit OP.

The first sub-optical unit O1 of the optical unit OP may include the first portion Ola and the second portion O1$b$ bonded to each other, the second sub-optical unit O2 of the optical unit OP may include the third portion O2$a$ and the fourth portion O2$b$ bonded to each other, the third sub-optical unit O3 of the optical unit OP may include the fifth portion O3$a$ and the sixth portion O3$b$ bonded to each other, the fourth sub-optical unit O4 of the optical unit OP may include the seventh portion O4$a$ and the eighth portion O4$b$ bonded to each other, and the fifth sub-optical unit O5 of the optical unit OP may include the ninth portion O5$a$ and the tenth portion O5$b$ bonded to each other.

The first portion Ola and the second portion O1$b$ of the first sub-optical unit O1 of the optical unit OP are bonded to each other on the first bonded surface Sab1, the third portion O2$a$ and the fourth portion O2$b$ of the second sub-optical unit O2 of the optical unit OP are bonded to each other on the second bonded surface Sab2, the fifth portion O3$a$ and the sixth portion O3$b$ of the third sub-optical unit O3 of the optical unit OP are bonded to each other on the third bonded surface Sab3, the seventh portion O4$a$ and the eighth portion O4$b$ of the fourth sub-optical unit O4 of the optical unit OP are bonded to each other on the fourth bonded surface Sab4, and the ninth portion O5$a$ and the tenth portion O5$b$ of the fifth sub-optical unit O5 of the optical unit OP are bonded to each other on the fifth bonded surface Sab5.

The bonded surfaces Sab at the boundaries between the respective portions include a material composition including a part of a first portion adjacent the boundary, the bonding element, and a part of a second portion adjacent the boundary extending perpendicular to the direction of the beam B.

The first bonded surface Sab1 of the first sub-optical unit O1 of the optical unit OP may form a first angle θ1 with the incident direction of the laser beam B, the second bonded surface Sab2 of the second sub-optical unit O2 of the optical unit OP may form a second angle θ2 with the incident direction of the laser beam B, the third bonded surface Sab3 of the third sub-optical unit O3 of the optical unit OP may form a third angle θ3 with the incident direction of the laser beam B, the fourth bonded surface Sab4 of the fourth sub-optical unit O4 of the optical unit OP may form a fourth angle θ4 with the incident direction of the laser beam B, and the fifth bonded surface Sab5 of the fifth sub-optical unit O5 of the optical unit OP may form a fifth angle θ5 with the incident direction of the laser beam B.

The first angle θ1, the second angle θ2, the third angle θ3, the fourth angle θ4, and the fifth angle θ5 may be smaller than about 45 degrees, and may be equal to or different from each other.

Also, based on the direction parallel to the incident direction of the laser beam B incident to the optical unit OP, the first bonded surface Sab1 of the first sub-optical unit O1 of the optical unit OP, the second bonded surface Sab2 of the second sub-optical unit O2 of the optical unit OP, the third bonded surface Sab3 of the third sub-optical unit O3 of the optical unit OP, the fourth bonded surface Sab4 of the fourth sub-optical unit O4 of the optical unit OP, and the fifth bonded surface Sab5 of the fifth sub-optical unit O5 of the optical unit OP are not disposed in a line with each other, but may be disposed to be offset from each other in a direction perpendicular to the emission of the laser beam B.

Figure 10:
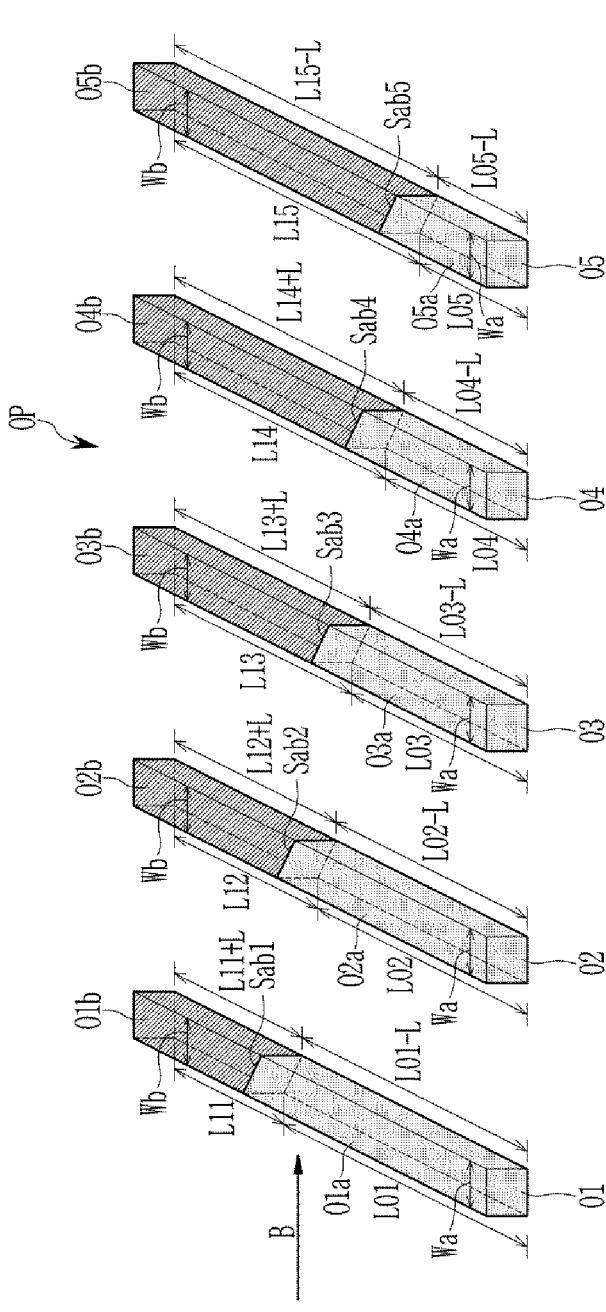
FIG. 10 is an exploded perspective view of optical units of FIG. 9.

Next, the sub-optical units of the optical unit of FIG. 9 are described in detail with reference to FIG. 10 along with FIG. 9. FIG. 10 is an exploded perspective view of optical units of FIG. 9.

Referring to FIG. 10 along with FIG. 9, the optical unit OP of the laser crystallization apparatus according to the present embodiment includes a plurality of sub-optical units O1, O2, O3, O4, and O5.

The first sub-optical unit O1 of the optical unit OP includes the first portion Ola and the second portion O1$b$ bonded to each other on the first bonded surface Sab1, and a first length L01 of the first surface of the first portion Ola of the first sub-optical unit O1 and a second length L11 of the first surface of the second portion O1$b$ may be different from a first length (L01-L) of the second surface facing the first surface of the first portion Ola of the first sub-optical unit O1 and a second length (L11+L) of the second surface of the second portion O1$b$ of the first sub-optical unit O1.

In detail, the first length L01-L of the second surface of the first portion Ola of the first sub-optical unit O1 may be shorter by the length difference L than the first length L01 of the first surface of the first portion Ola of the first sub-optical unit O1. The second length L11+L of the second surface of the second portion O1$b$ of the first sub-optical unit O1 may be longer by the length difference L than the second length L11 of the first surface of the second portion O1$b$ of the first sub-optical unit O1. That is, based on the direction perpendicular to the incident direction of the laser beam B, the width of the first bonded surface Sab1 of the first sub-optical unit O1 may be the same as the length difference L.

The length difference L and the width of the first bonded surface Sab1 may be about 0.3% to about 0.6% of the entire length of the first sub-optical unit O1. For example, the entire length of the first sub-optical unit O1 is about 2200 mm, and the length difference L and the width of the first bonded surface Sab1 may be about 10 mm.

The width of the first bonded surface Sab1 refers to a combined width including part of the first portion Ola, part of the second portion O1b, and the bonding element area at the boundary of the first portion Ola and the second portion 0 lb. This composition is representative of the other bonded surfaces discussed herein.

As described herein, lengths measured in the direction perpendicular to the incident direction of the laser beam B.

Also, the first bonded surface Sab1 of the first sub-optical unit O1 of the optical unit OP may form the first angle $\theta 1$ with the incident direction of the laser beam B, and based on the direction parallel to the incident direction of the laser beam B, the first width Wa of the first portion Ola of the first sub-optical unit O1 and the second width Wb of the second portion O1b of the first sub-optical unit O1 may be the same as each other on the first bonded surface Sab1.

Similarly, the second sub-optical unit O2 of the optical unit OP includes the third portion O2a and the fourth portion O2b bonded to each other on the second bonded surface Sab2, and the third length L02 of the first surface of the third portion O2a of the second sub-optical unit O2 and the fourth length L12 of the first surface of the fourth portion O2b of the second sub-optical unit O2 may have the difference from the third length L02-L of the second surface of the third portion O2a of the second sub-optical unit O2 and the fourth length L12+L of the second surface of the fourth portion O2b of the second sub-optical unit O2 by the length difference L. That is, based on the direction perpendicular to the incident direction of the laser beam B, on the second sub-optical unit O2, the width of the second bonded surface Sab2 may be the same length difference L.

The length difference L and the width of the second bonded surface Sab2 may be about 0.3% to about 0.6% of the entire length of the second sub-optical unit O2. For example, when the entire length of the second sub-optical unit O2 is about 2200 mm, the length difference L and the width of the second bonded surface Sab2 may be about 10 mm.

The above-described lengths are the lengths measured in the direction perpendicular to the incident direction of the laser beam B.

Also, the second bonded surface Sab2 of the second sub-optical unit O2 of the optical unit OP may form the second angle $\theta 2$ with the incident direction of the laser beam B, based on the direction parallel to the incident direction of the laser beam B, and the first width Wa of the third portion O2a of the second sub-optical unit O2 and the second width Wb of the fourth portion O2b of the second sub-optical unit O2 may be the same as each other on the second bonded surface Sab2.

The third sub-optical unit O3 of the optical unit OP includes the fifth portion O3a and the sixth portion O3b bonded to each other on the third bonded surface Sab3, and the fifth length L03 of the first surface of the fifth portion O3a of the third sub-optical unit O3 and the sixth length L13 of the first surface sixth portion O3b of the third sub-optical unit O3 may have the difference from the fifth length L03-L of the second surface of the fifth portion O3a of the third sub-optical unit O3 and the sixth length L13+L of the second surface of the sixth portion O3b of the third sub-optical unit O3 by the length difference L. That is, based on the direction perpendicular to the incident direction of the laser beam B, on the third sub-optical unit O3, the width of the third bonded surface Sab3 may be the same as the length difference L.

The length difference L and the width of the third bonded surface Sab3 may be about 0.3% to about 0.6% of the entire length of the third sub-optical unit O3. For example, when the entire length of the third sub-optical unit O3 is about 2200 mm, the length difference L and the width of the third bonded surface Sab3 may be about 10 mm.

All lengths described above are lengths measured in the direction perpendicular to the direction in which the laser beam B is incident.

Also, the third bonded surface Sab3 of the third sub-optical unit O3 of the optical unit OP may form the third angle $\theta 3$ with the incident direction of the laser beam B, based on the direction parallel to the incident direction of the laser beam B, and the first width Wa of the fifth portion O3a of the third sub-optical unit O3 and the second width Wb of the sixth portion O3b of the third sub-optical unit O3 may be the same as each other on the third bonded surface Sab3.

The fourth sub-optical unit O4 of the optical unit OP includes the seventh portion O4a and the eighth portion O4b bonded to each other on the fourth bonded surface Sab4, and the seventh length L04 of the first surface of the seventh portion O4a of the fourth sub-optical unit O4 and the eighth length L14 of the first surface of the eighth portion O4b of the fourth sub-optical unit O4 may have the difference from the seventh length L04-L of the second surface seventh portion O4a of the fourth sub-optical unit O4 and the eighth length L14+L of the second surface of the eighth portion O4b of the fourth sub-optical unit O4 by the length difference L. That is, based on the direction perpendicular to the incident direction of the laser beam B, the width of the fourth bonded surface Sab4 may be the same as the length difference L on the fourth sub-optical unit O4.

The length difference L and the width of the fourth bonded surface Sab4 may be about 0.3% to about 0.6% of the entire length of the fourth sub-optical unit O4. For example, when the entire length of the fourth sub-optical unit O4 is about 2200 mm, the length difference L and the width of the fourth bonded surface Sab4 may be about 10 mm.

All lengths described above are lengths measured in the direction perpendicular to the direction in which the laser beam B is incident.

Also, the fourth bonded surface Sab4 of the fourth sub-optical unit O4 of the optical unit OP may form the fourth angle $\theta 4$ of the incident direction of the laser beam B, based on the direction parallel to the incident direction of the laser beam B, and the first width Wa of the seventh portion O4a of the fourth sub-optical unit O4 and the second width Wb of the eighth portion O4b of the fourth sub-optical unit O4 may be the same as each other on the fourth bonded surface Sab4.

Similarly, the fifth sub-optical unit O5 of the optical unit OP includes the ninth portion O5a and the tenth portion O5b bonded to each other on the fifth bonded surface Sab5, and the ninth length L05 of the first surface of the ninth portion O5a of the fifth sub-optical unit O5 and the tenth length L15 of the first surface tenth portion O5b of the fifth sub-optical unit O5 may have the difference from the ninth length L05-L of the second surface of the ninth portion O5a of the fifth sub-optical unit O5 and the tenth length L15+L of the second surface of the tenth portion O5b of the fifth sub-optical unit O5 by the length difference L. That is, based on the direction perpendicular to the direction in which the laser beam B is incident, the width of the fifth bonded surface Sab5 may be equal to the length difference L on the fifth sub-optical unit O5.

The length difference L and the width of the fifth bonded surface Sab5 may be about 0.3% to about 0.6% of the entire length of the fifth sub-optical unit O5. For example, when the entire length of the fifth sub-optical unit O5 is about 2200 mm, the length difference L and the width of the fifth bonded surface Sab5 may be about 10 mm.

All lengths described above are lengths measured in the direction perpendicular to the direction in which the laser beam B is incident.

The fifth bonded surface Sab5 of the fifth sub-optical unit O5 of the optical unit OP may form the fifth angle θ5 with the incident direction of the laser beam B, and based on the direction parallel to the incident direction of the laser beam B, the first width Wa of the ninth portion O5a of the fifth sub-optical unit O5 and the second width Wb of the tenth portion O5b of the fifth sub-optical unit O5 may be the same as each other on the fifth bonded surface Sab5.

The first length L01 of the first portion O1a of the first sub-optical unit O1 of the optical unit OP, the third length L02 of the third portion O2a of the second sub-optical unit O2 of the optical unit OP, the fifth length L03 of the fifth portion O3a of the third sub-optical unit O3 of the optical unit OP, the seventh length L04 of the seventh portion O4a of the fourth sub-optical unit O4 of the optical unit OP, and the ninth length L05 of the ninth portion O5a of the fifth sub-optical unit O5 of the optical unit OP may be different from each other. Here, the first length L01, the third length L02, the fifth length L03, the seventh length L04, the ninth length L05 may be lengths measured in the direction perpendicular to the incident direction of the laser beam B.

Similarly, the second length L11 of the second portion O1b of the first sub-optical unit O1 of the optical unit OP, the fourth length L12 of the fourth portion O2b of the second sub-optical unit O2 of the optical unit OP, the sixth length L13 of the sixth portion O3b of the third sub-optical unit O3 of the optical unit OP, the eighth length L14 of the eighth portion O4b of the fourth sub-optical unit O4 of the optical unit OP, and the tenth length L15 of the tenth portion O5b of the fifth sub-optical unit O5 of the optical unit OP may be different from each other. Here, the second length L11, the fourth length L12, the sixth length L13, the eighth length L14, and the tenth length L15 may be lengths measured in the direction perpendicular of the incident direction of the laser beam B.

The first portion O1a and the second portion O1b of the first sub-optical unit O1 of the optical unit OP may be bonded to each other through the optical contact bonding or the welding, the third portion O2a and the fourth portion O2b of the second sub-optical unit O2 of the optical unit OP may be bonded to each other through the optical contact bonding or the welding, the fifth portion O3a and the sixth portion O3b of the third sub-optical unit O3 of the optical unit OP may be bonded to each other through the optical contact bonding or the welding, the seventh portion O4a and the eighth portion O4b of the fourth sub-optical unit O4 of the optical unit OP may be bonded to each other through the optical contact bonding or the welding, and the ninth portion O5a and the tenth portion O5b of the fifth sub-optical unit O5 of the optical unit OP may be bonded to each other through the optical contact bonding or the welding.

Also, the first sub-optical unit O1, the second sub-optical unit O2, the third sub-optical unit O3, the fourth sub-optical unit O4, and the fifth sub-optical unit O5 of the optical unit OP may be sequentially disposed along the direction parallel to the incident direction of the laser beam B, and the first sub-optical unit O1, the second sub-optical unit O2, the third sub-optical unit O3, the fourth sub-optical unit O4, and the fifth sub-optical unit O5 of the optical unit OP may be bonded to each other through the optical contact bonding or the welding.

Based on the direction parallel to the incident direction of the laser beam B incident to the optical unit OP, the first bonded surface Sab1 of the first sub-optical unit O1 of the optical unit OP, the second bonded surface Sab2 of the second sub-optical unit O2 of the optical unit OP, the third bonded surface Sab3 of the third sub-optical unit O3 of the optical unit OP, the fourth bonded surface Sab4 of the fourth sub-optical unit O4 of the optical unit OP, and the fifth bonded surface Sab5 of the fifth sub-optical unit O5 of the optical unit OP are not disposed in a line with each other, but may be disposed to be offset from each other in a direction perpendicular to the emission of the laser beam B.

According to the embodiment illustrated in FIG. 9 and FIG. 10, it is described that the optical unit of the laser crystallization apparatus according to the embodiment includes five sub-optical units O1, O2, O3, O4, and O5, however it is not limited thereto, and the number of a plurality of sub-optical units may be changed.

Figure 11:
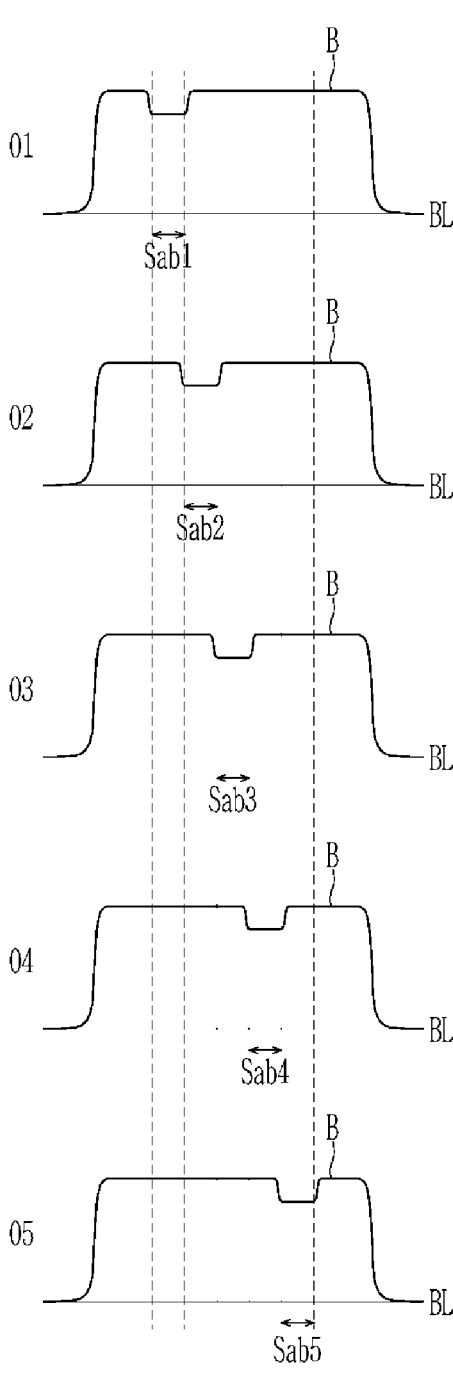
FIG. 11 is a graph conceptually illustrating changes in intensity of a laser beam passing through an optical unit of a laser crystallization apparatus according to another embodiment.

Now, a change in intensity of a laser beam passing through the optical unit of the laser crystallization apparatus according to an embodiment is described with reference to FIG. 11 along with FIG. 9 and FIG. 10. FIG. 11 is a graph conceptually illustrating changes in intensity of a laser beam passing through an optical unit of a laser crystallization apparatus according to another embodiment.

Referring to FIG. 11 along with FIG. 9 and FIG. 10, while the laser beam B passes through the first sub-optical unit O1, the second sub-optical unit O2, the third sub-optical unit O3, the fourth sub-optical unit O4, and the fifth sub-optical unit O5 of the optical unit OP, the intensity BL of the laser beam B may be reduced in the first bonded surface Sab1 of the first sub-optical unit O1 of the optical unit OP, the second bonded surface Sab2 of the second sub-optical unit O2 of the optical unit OP, the third bonded surface Sab3 of the third sub-optical unit O3 of the optical unit OP, the fourth bonded surface Sab4 of the fourth sub-optical unit O4 of the optical unit OP, and the fifth bonded surface Sab5 of the fifth sub-optical unit O5 of the optical unit OP.

As described with reference to FIG. 9 and FIG. 10, based on the direction parallel to the incident direction of the laser beam B incident to the optical unit OP of the laser crystallization apparatus according to the embodiment, because the first bonded surface Sab1 of the first sub-optical unit O1 of the optical unit OP, the second bonded surface Sab2 of the second sub-optical unit O2 of the optical unit OP, the third bonded surface Sab3 of the third sub-optical unit O3 of the optical unit OP, the fourth bonded surface Sab4 of the fourth sub-optical unit O4 of the optical unit OP, and the fifth bonded surface Sab5 of the fifth sub-optical unit O5 of the optical unit OP are not disposed in one line and are disposed to be offset from each other, the first bonded surface Sab1, the second bonded surface Sab2, the third bonded surface Sab3, the fourth bonded surface Sab4, and the fifth bonded surface Sab5, in which the intensity BL of the laser beam B is changed, do not overlap each other.

Accordingly, the change of the intensity BL of the laser beam B passing through the optical unit OP is not concentrated at a specific position, therefore the uniform laser beam B may be supplied substantially evenly to the substrate 14 according to the position of the bonded surfaces.

Figure 12:
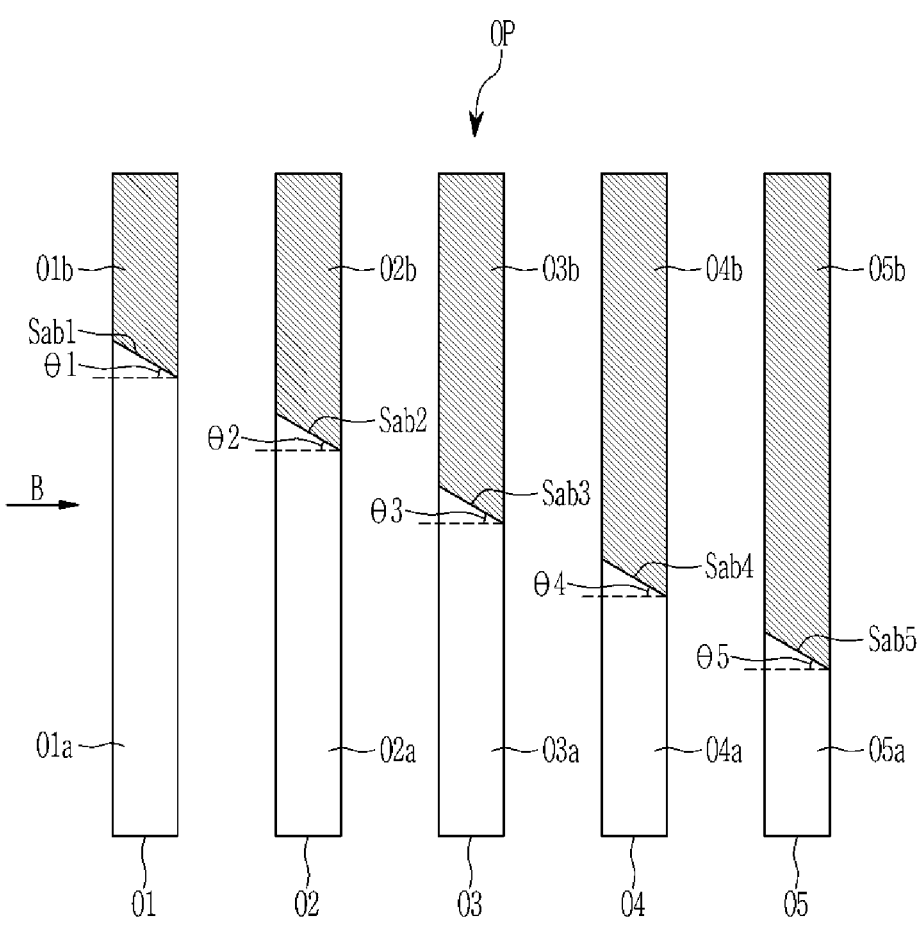
FIG. 12 is a view illustrating an example of an optical unit of a laser crystallization apparatus according to another embodiment.

Next, the laser crystallization apparatus according to another embodiment is described with reference to FIG. 12. FIG. 12 is a view illustrating an example of an optical unit of a laser crystallization apparatus according to another embodiment.

As described herein, the laser crystallization apparatus according to the present embodiment includes a plurality of optical units OP1, M, OP2, W1, and W2, and at least one among a plurality of optical units OP1, M, OP2, W1, and W2 of the laser crystallization apparatus may have the structure of the optical unit OP illustrated in FIG. 12.

Referring to FIG. 12, the optical unit OP of the laser crystallization apparatus according to the present embodiment may include a plurality of sub-optical units O1, O2, O3, O4, and O5 separated from each other.

The first sub-optical unit O1 of the optical unit OP may include the first portion O1a and the second portion O1b bonded to each other, the second sub-optical unit O2 of the optical unit OP may include the third portion O2a and the fourth portion O2b bonded to each other, the third sub-optical unit O3 of the optical unit OP may include the fifth portion O3a and the sixth portion O3b bonded to each other, the fourth sub-optical unit O4 of the optical unit OP may include the seventh portion O4a and the eighth portion O4b bonded to each other, and the fifth sub-optical unit O5 of the optical unit OP may include the ninth portion O5a and the tenth portion O5b bonded to each other.

The first portion O1a and the second portion O1b of the first sub-optical unit O1 of the optical unit OP are bonded to each other on the first bonded surface Sab1, the third portion O2a and the fourth portion O2b of the second sub-optical unit O2 of the optical unit OP are bonded to each other on the second bonded surface Sab2, the fifth portion O3a and the sixth portion O3b of the third sub-optical unit O3 of the optical unit OP are bonded to each other on the third bonded surface Sab3, the seventh portion O4a and the eighth portion O4b of the fourth sub-optical unit O4 of the optical unit OP are bonded to each other on the fourth bonded surface Sab4, and the ninth portion O5a and the tenth portion O5b of the fifth sub-optical unit O5 of the optical unit OP are bonded to each other on the fifth bonded surface Sab5.

The first bonded surface Sab1 of the first sub-optical unit O1 of the optical unit OP, the second bonded surface Sab2 of the second sub-optical unit O2 of the optical unit OP, the third bonded surface Sab3 of the third sub-optical unit O3 of the optical unit OP, the fourth bonded surface Sab4 of the fourth sub-optical unit O4 of the optical unit OP, and the fifth bonded surface Sab5 of the fifth sub-optical unit O5 of the optical unit OP may respectively form the first angle θ1, the second angle θ2, the third angle θ3, the fourth angle θ4, and the fifth angle θ5 by the incident direction of the laser beam B incident to the optical unit OP. In addition, the first angle θ1, the second angle θ2, the third angle θ3, the fourth angle θ4, and the fifth angle θ5 may be the same as or different from each other.

Also, based on the direction parallel to the incident direction of the laser beam B incident to the optical unit OP, the first bonded surface Sab1 of the first sub-optical unit O1 of the optical unit OP, the second bonded surface Sab2 of the second sub-optical unit O2 of the optical unit OP, the third bonded surface Sab3 of the third sub-optical unit O3 of the optical unit OP, the fourth bonded surface Sab4 of the fourth sub-optical unit O4 of the optical unit OP, and the fifth bonded surface Sab5 of the fifth sub-optical unit O5 of the optical unit OP are not disposed in a line with each other, but may be disposed to be offset from each other in a direction perpendicular to the emission of the laser beam B.

According to the embodiment illustrated in FIG. 12, it is described that the optical unit of the laser crystallization apparatus according to an embodiment incudes five sub-optical units O1, O2, O3, O4, and O5, however it is not limited thereto, and the number of a plurality of sub-optical units may be changed.

Many characteristics of the optical units of the laser crystallization apparatus according to the embodiments described herein are applicable to all of the optical units of the laser crystallization apparatus according to the present embodiment.

As described herein, the laser crystallization apparatuses according to the embodiments include a plurality of optical units, and at least one among a plurality of optical units includes the first portion and the second portion bonded to each other, at least one among a plurality of optical units may include a plurality of sub-optical units including the first portion and the second portion bonded to each other, and a plurality of sub-optical units may be bonded to each other or separated from each other. In addition, the bonded surfaces of a plurality of sub-optical units may be disposed to be deviated or offset from each other without being disposed in one line along the direction parallel to the incident direction of the laser beam. Accordingly, it is possible to form the laser crystallization apparatus including the optical unit having a large size without increasing the manufacturing cost of the laser crystallization apparatus and to reduce the uniformity reduction of the laser beam.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A laser crystallization apparatus comprising:
a light source configured to irradiate a laser beam; and
an optical unit having a light receiving surface on which the laser beam is incident in an incident direction,
wherein the optical unit includes a first portion and a second portion bonded to each other on a bonded surface to form a single plano-convex cylindrical lens,
a first width of the first portion and a second width of the second portion are the same as each other on the bonded surface based on a direction parallel to the incident direction of the laser beam,
the light receiving surface includes the first portion, the second portion, and the bonded surface,
the light source and the optical unit are arranged such that the light source is configured to irradiate the laser beam continuously on the light receiving surface including the first portion, to the second portion, and the bonded surface,
the bonded surface is configured to reduce an intensity of the laser beam, and
the first portion and the second portion are bonded by optical contact bonding.

2. The laser crystallization apparatus of claim 1, wherein based on a direction perpendicular to the incident direction of the laser beam, a first length of the first portion and a second length of the second portion are different from each other.

3. The laser crystallization apparatus of claim 1, wherein the bonded surface is parallel to the incident direction of the laser beam.

4. The laser crystallization apparatus of claim 1, wherein the bonded surface is inclined to form a predetermined angle with the incident direction of the laser beam.

5. The laser crystallization apparatus of claim 4, wherein the width of the bonded surface is about 0.3% to about 0.6% of a length of the optical unit, and the width of the bonded surface is measured in the direction parallel to the incident direction of the laser beam.

6. The laser crystallization apparatus of claim 1, wherein a length of the optical unit is about 2000 mm to about 2500 mm, and the length of the optical unit is measured in a direction perpendicular to the incident direction of the laser beam.

7. A laser crystallization apparatus comprising:

a light source configured to irradiate a laser beam; and an optical unit to which the laser beam is incident in an incident direction and including a plurality of sub-optical units, wherein each of the plurality of sub-optical units includes a first portion and a second portion bonded to each other on a bonded surface to form a single plano-convex cylindrical lens, the plurality of sub-optical units are sequentially arranged based on a direction parallel to the incident direction of the laser beam, and the bonded surface is configured to reduce an intensity of the laser beam, and the first portion and the second portion are bonded by optical contact bonding.

8. The laser crystallization apparatus of claim 7, wherein the plurality of sub-optical units include a first sub-optical unit and a second sub-optical unit, and the length of the first portion of the first sub-optical unit is different from the length of the first portion of the second sub-optical unit.

9. The laser crystallization apparatus of claim 8, wherein the bonded surface of the first sub-optical unit is offset from the bonded surface of the second sub-optical unit so as to not overlap in the direction parallel to the incident direction of the laser beam.

10. The laser crystallization apparatus of claim 9, wherein based on the direction parallel to the incident direction of the laser beam, a first width of the first portion and a second width of the second portion are the same as each other on the bonded surface.

11. The laser crystallization apparatus of claim 10, wherein the bonded surface of the first sub-optical unit and the bonded surface of the second sub-optical unit are parallel to the incident direction of the laser beam.

12. The laser crystallization apparatus of claim 11, wherein the plurality of sub-optical units are disposed to be bonded along the incident direction of the laser beam.

13. The laser crystallization apparatus of claim 11, wherein the plurality of sub-optical units are disposed to be separated from each other along the incident direction of the laser beam.

14. The laser crystallization apparatus of claim 10, wherein the bonded surface of the first sub-optical unit and the bonded surface of the second sub-optical unit are inclined to form a predetermined angle with the incident direction of the laser beam.

15. The laser crystallization apparatus of claim 14, wherein a width of the bonded surface of the first sub-optical unit is about 0.3% to about 0.6% of a length of the first sub-optical unit, and the width of the bonded surface is measured in the direction parallel to the incident direction of the laser beam.

16. The laser crystallization apparatus of claim 15, wherein the length of the first sub-optical unit is about 2000 mm to about 2500 mm, and the length of the first sub-optical unit is measured in a direction perpendicular to the incident direction of the laser beam.

17. The laser crystallization apparatus of claim 14, wherein the plurality of sub-optical units are disposed to be bonded along the incident direction of the laser beam.

18. The laser crystallization apparatus of claim 15, wherein the plurality of sub-optical units are disposed to be separated from each other along the incident direction of the laser beam.

19. A laser crystallization apparatus comprising:

a light source configured to irradiate a laser beam; and an optical unit having a light receiving surface to which the laser beam is incident in an incident direction, wherein the optical unit includes a first portion and a second portion bonded to each other on a bonded surface, the light receiving surface includes the first portion, the second portion, and the bonded surface, the light source and the optical unit are arranged such that the light source is configured to irradiate the laser beam continuously on the light receiving surface including the first portion, the second portion, and the bonded surface, the bonded surface is inclined to form a predetermined angle less than 45 degrees with the incident direction of the laser beam, and the bonded surface is configured to reduce an intensity of the laser beam, and the first portion and the second portion are bonded by optical contact bonding.

* * * * *